(12) United States Patent
Li et al.

(10) Patent No.: US 8,604,788 B2
(45) Date of Patent: Dec. 10, 2013

(54) METHOD FOR THREE-DIMENSIONAL TURBO SPIN ECHO IMAGING

(75) Inventors: Guo Bin Li, Shenzhen (CN); Dominik Paul, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 399 days.

(21) Appl. No.: 13/097,289

(22) Filed: Apr. 29, 2011

(65) Prior Publication Data

US 2011/0267053 A1 Nov. 3, 2011

(30) Foreign Application Priority Data

Apr. 30, 2010 (CN) .......................... 2010 1 0160442

(51) Int. Cl.
*G01V 3/00* (2006.01)

(52) U.S. Cl.
USPC .......................................... 324/309; 324/318

(58) Field of Classification Search
USPC ............................ 324/300–322; 600/407–445
See application file for complete search history.

(56) References Cited

U.S. PATENT DOCUMENTS

| 7,034,533 B2 * | 4/2006 | Mugler et al. ................ 324/318 |
| 7,164,268 B2 * | 1/2007 | Mugler et al. ................ 324/307 |

OTHER PUBLICATIONS

"Variable-Rate Selective Excitation for Rapid MRI Sequences," Hargreaves et al., Magnetic Resonance in Medicine, vol. 2 (2004) pp. 590-597.
"Variable-Rate Selective Excitation," Conolly et al., Journal of Magnetic Resonance, vol. 78 (1988) pp. 440-458.
"Correction of Slab Boundary Artifact using Histogram Matching," Kholmovski et al. Proc. Intl. Soc. Mag. Reson. Med., vol. 9, (2001) p. 738.

* cited by examiner

*Primary Examiner* — Brij Shrivastav
(74) *Attorney, Agent, or Firm* — Schiff Hardin LLP

(57) ABSTRACT

A three-dimensional turbo spin echo imaging method of applying, within a repetition time TR, N groups of pulses to respectively scan N slabs in succession, with each group including one excitation pulse and more than one refocusing pulse, wherein N is a positive integer greater than 1, is improved by applying a first slice selection gradient at the same time as applying each said excitation pulse, and applying a second slice selection gradient at the same time as applying each said refocusing pulse, and applying a phase encoding gradient after having applied each refocusing pulse, then applying a frequency encoding gradient and acquiring scan signals during the duration of the frequency encoding gradient. An image according to the scan signals is reconstructed.

10 Claims, 6 Drawing Sheets

METHOD FOR THREE-DIMENSIONAL TURBO SPIN ECHO IMAGING

BACKGROUND OF THE INVENTION

1. Field of the Invention

The present invention relates to the technical field of magnetic resonance imaging and, particularly, to a method for three-dimensional turbo spin echo imaging.

2. Description of the Prior Art

The principles of magnetic resonance imaging (MRI) are as follows. After having applied an external magnetic field, protons in the examined tissues are excited by radio frequency (RF) pulses and they absorb certain energy, which results in their resonance. When the radiation of RF pulses is stopped, the excited protons release the absorbed energy gradually in the form of scan signals. By then acquiring the scan signals and processing them using known image reconstruction technology, a scan image of the examined tissue can be obtained. In three-dimensional MRI imaging technology, slabs are used as units for the protons in the examined tissues to be excited, with each slab including several slices.

In this case, the external magnetic field includes a main magnetic field and three orthogonal gradient magnetic fields, and in the three orthogonal gradient magnetic fields, the direction which is the same as that of the main magnetic field is usually defined as Z axis direction, with the X axis and the Y axis being orthogonal with Z axis. Specifically, the gradient magnetic field along Z axis direction is referred to as the slice selection (SS) gradient, at the same time, Z axis direction may also be referred to as SS direction; the gradient magnetic field along Y axis direction is referred to as phase encoding (PE) gradient, at the same time, Y axis direction may also be referred to as PE direction; and the gradient magnetic field along X axis direction is referred to as frequency encoding gradient, in practical applications, the frequency encoding gradient is also referred to as readout (RO) gradient, and X axis direction may also be referred to as RO direction.

The method for three-dimensional turbo spin echo (3D-TSE) imaging is an imaging method frequently used in the three-dimensional MRI technology, and FIG. 1 is a diagram of the working principles of the 3D-TSE imaging method in the prior art. The interval time between two adjacent selective excitation pulses 101 is usually referred to as a repetition time (TR), with a TR including an acquisition window and a waiting time; a first TR and a second TR are shown in FIG. 1, and the first TR will be described in detail. As shown in FIG. 1, in the acquisition window of the first TR, first, a selective excitation pulse 101 is used to excite a current slab, then a number of non-selective refocusing pulses 102 are applied, with the angle of each refocusing pulse 102 being either the same or different. When the angle of each refocusing pulse 102 is the same, this conventional 3D-TSE imaging technology. When the angle of each refocusing pulse 102 is different, then the 3D-TSE imaging technology with this feature is usually referred to as the three-dimensional spin echo imaging technology with changeable flip angles (SPACE, Sampling Perfection with Application optimized Contrast by using different flip angle Evolutions). A phase encoding gradient is applied after each time having applied a refocusing pulse 102 (not shown in the figure), then a frequency encoding gradient is applied (not shown in the figure), and one echo acquisition is carried out during the duration of the frequency encoding gradient. Thus the acquisition of scan signals and a number of echo acquisitions can form an echo chain for the subsequent reconstruction of images. During the waiting time of the first TR, the excited protons gradually return to the state before the excitation; when the waiting time ends, the excited protons have already returned to the state before the excitation, which means that the scan of the first TR has completed. In the next several consecutive TRs, the scan of the current slab can be performed repeatedly, for example, during the second TR, the above-mentioned process can be repeated, then after the completion of the scan of the second TR, the next slab is scanned, and the scan method for the next slab is the same as that of the current slab. Furthermore, the reason for the selective excitation pulse 101 being able to achieve the excitation of different slabs is that the selective excitation pulses 101 are different for different slabs, and corresponding explanation and illustration will be set forth hereinbelow.

In FIG. 1, the shape of a peak denotes the selective excitation pulse 101, and rectangles denote the non-selective refocusing pulses 102, with the height of the peak shape and rectangle denoting the size of the pulse angle. Those skilled in the art understand that the selective excitation pulse described herein refers to both the excitation pulse and slice selection gradient which are applied to the tissues to be examined simultaneously, thus making the excitation pulse selective. Such an excitation pulse with selectivity is referred to as a selective excitation pulse in the present invention. The reason for each selective excitation pulse being able to achieve the selection of different slabs is that the strength of the slice selection gradient and/or the center frequency of the excitation pulse are modulated for different slabs. The non-selective refocusing pulses described herein refer to the slice selection gradient not being applied at the same time as applying refocusing pulses to the examined tissues, thus making the refocusing pulses excite the protons in the whole examined tissue, therefore the refocusing pulses do not possess selectivity. Furthermore, for the sake of convenience, the pulses described in the present document refer to the radio frequency pulses.

It can be seen in the 3D-TSE imaging method in the prior art that only one slab can be scanned within one TR, and in order to scan the next slab, there must be a wait at least until the next TR, and the length of waiting time within a TR is far longer than the length of the acquisition window. Therefore, the imaging efficiency is reduced.

A method for multi-slice magnetic resonance imaging is disclosed in Chinese patent application no. 98121433.9. According to this method, a sequence of pulses is applied successively to different slices at M (≥2) different positions so as to obtain H (≥1) groups of magnetic resonance data, with said successively applied steps being repeated within the repetition time TR, and this method comprising the following steps that: a refocusing pulse with the selectivity only to a current slice is applied after each sequence of pulses has been applied to each slice in the repetition time TR; and then a forced recovery pulse with selectivity only to the current slice is applied.

SUMMARY OF THE INVENTION

An object of the present invention is to provide a method for three-dimensional turbo spin echo imaging that improves the imaging efficiency of a magnetic resonance imaging system.

This object is achieved in accordance with the present invention by a method for three-dimensional turbo spin echo imaging including applying successively N groups of pulses within a repetition time, with each group being used to scan one slab and including one excitation pulse and more than one refocusing pulse, wherein N is a positive integer greater than 1. The method further includes:

Applying a first slice selection gradient at the same time as applying the excitation pulse, and applying a second slice selection gradient at the same time as applying the refocusing pulse;

Applying a phase encoding gradient after having applied each the refocusing pulse, then applying a frequency encoding gradient, and acquiring the scan signals during the duration of the frequency encoding gradient; and Reconstructing the images according to the scan signals.

Preferably, the pulses from the first group to the $(N-P)^{th}$ group in the N groups of pulses are applied successively to the slabs with odd serial numbers, then the pulses from the $(N-P+1)^{th}$ group to the $N^{th}$ group are applied successively to the slabs with even serial numbers. Alternatively, the pulses from the first group to the $P^{th}$ group in the N groups of pulses are applied successively to the slabs with even serial numbers, and then the pulses from the $(P+1)^{th}$ group to the $N^{th}$ group in the N groups of pulses are applied successively to the slabs with odd serial numbers. In this case, P is the result of rounding down N/2.

If the type of the scan is fat-suppressed imaging, then the frequencies of the excitation pulse and the refocusing pulses are set to be equal to the resonance frequency of water protons, and the polarities of the first slice selection gradient and the second slice selection gradient are set to be opposite.

If the type of the scan is non-fat-suppressed imaging, then the frequencies of the excitation pulse and the refocusing pulses are set to be smaller than the resonance frequency of water protons, and the polarities of the first slice selection gradient and the second slice selection gradient are set to be the same or opposite, and the thickness of the slab acted on by each group of pulses is set to be greater than the preset thickness of the slab.

Preferably, the frequencies of the excitation pulse and the refocusing pulses are set to be smaller than the resonance frequency of water protons by 1.75 per million; and the thickness of the slab acted on by the each group of pulses is set to be 120-125% of the preset thickness of the slab.

The method further includes correcting the strength of the scan signals after having acquired the scan signals.

A further embodiment of the method includes dividing the slab into 5 regions along the slice selection direction, correcting the strength of the scan signals of the two regions adjacent to the middle region by using histogram matching, and correcting the strength of the scan signals of the two edge regions by using three-dimensional interpolation.

It can be seen from the above-mentioned technical solution that the three-dimensional turbo spin echo imaging method provided by the present method includes applying a first slice selection gradient at the same time as applying each excitation pulse, and applying a second slice selection gradient at the same time as applying each refocusing pulse, so that the applied refocusing pulse each time only affects the current slab, and other slabs can be scanned simultaneously during the time period waiting for the excited protons in the current slab to return to the state before the excitation, therefore, the present invention shortens the imaging time and is able to improve imaging efficiency.

Based on the technology of an improved imaging efficiency, the present invention further provides a solution for image quality optimization. For example, slabs with odd serial numbers along the slice selection can be scanned first, then slabs with even serial numbers along the slice selection are scanned. Furthermore, the pulse frequency and the gradient polarity are adjusted respectively for fat-suppressed imaging and non-fat-suppressed imaging. The strength of the scan signals can be corrected by using histogram matching and three-dimensional interpolation after having acquired the scan signals, so that the image quality can be improved.

DESCRIPTION OF THE PREFERRED EMBODIMENTS

The technical solution of the present invention will be further described below in detail according to three embodiments.

The First Embodiment

Figure 2:
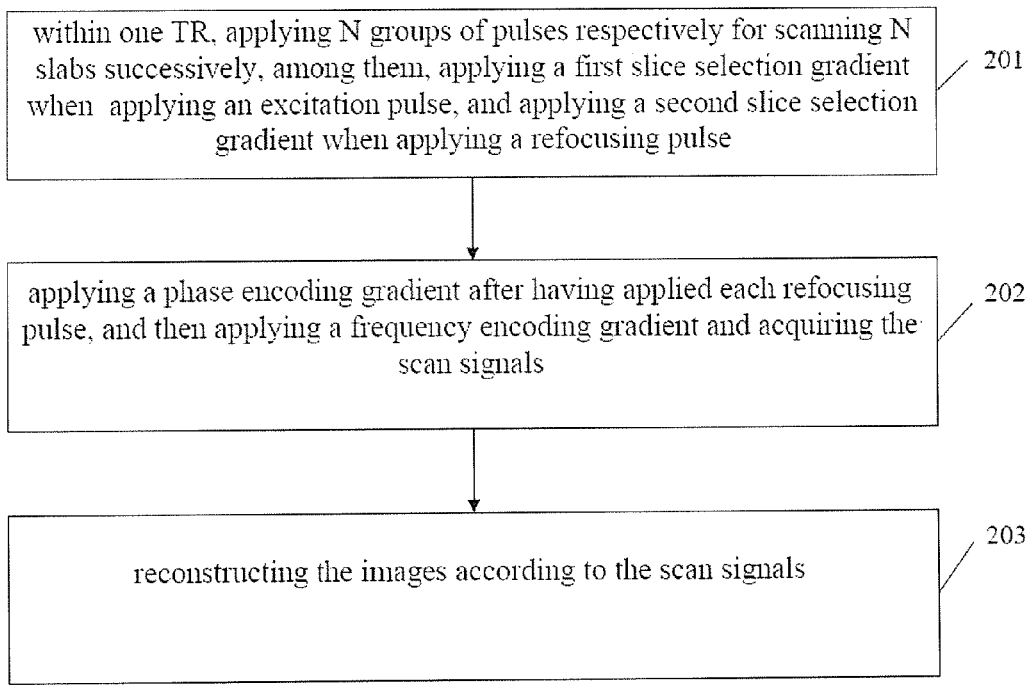
FIG. 2 is a flowchart of a first embodiment of a 3D-TSE imaging method provided by the present invention.

FIG. 2 is a flowchart of the first embodiment of a 3D-TSE imaging method provided by the present invention. As shown in FIG. 2, the method comprises the following steps:

Step 201: within a TR, the magnetic resonance imaging system applies N groups of pulses for respectively scanning N slabs in succession, with each group including one excitation pulse and more than one refocusing pulse, and it applies a first slice selection gradient at the same time as applying each said excitation pulse, and applies a second slice selection gradient at the same time as applying each said refocusing pulse, wherein N is a positive integer greater than 1.

Step 202, the magnetic resonance imaging system applies a phase encoding gradient after having applied each refocusing pulse, then applies a frequency encoding gradient, and acquires the scan signals during the duration of the frequency encoding gradient.

Step 203, the magnetic resonance imaging system reconstructs images according to the scan signals and optionally outputs the scan images.

The abovementioned steps will be described in detail below in conjunction with FIG. 3.

Figure 1:
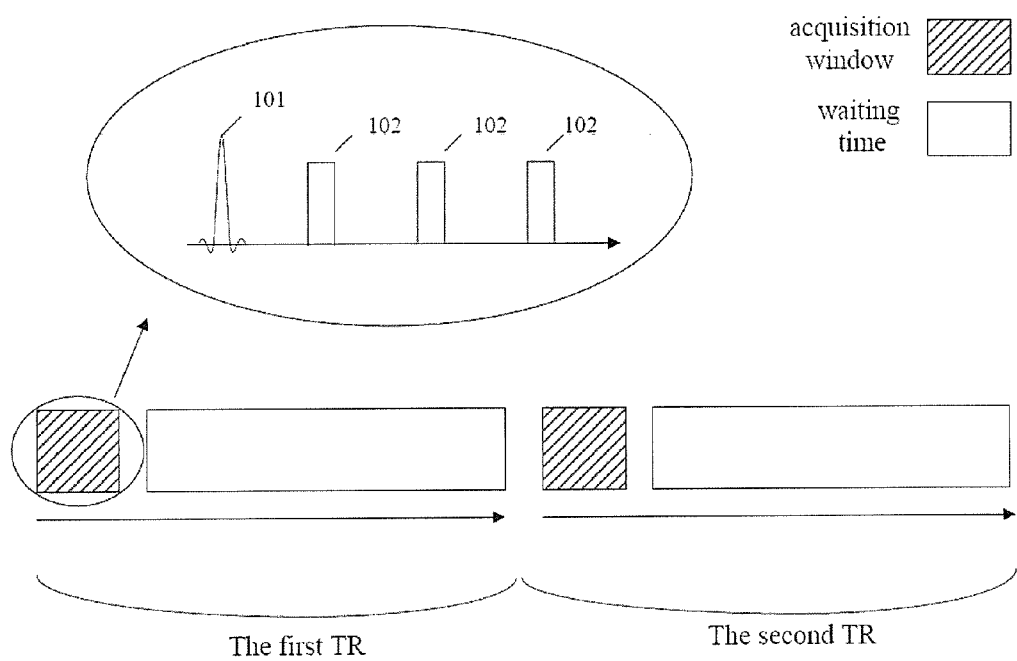
FIG. 1 is a diagram of the working principles of a 3D-TSE imaging method in the prior art.
Figure 3:
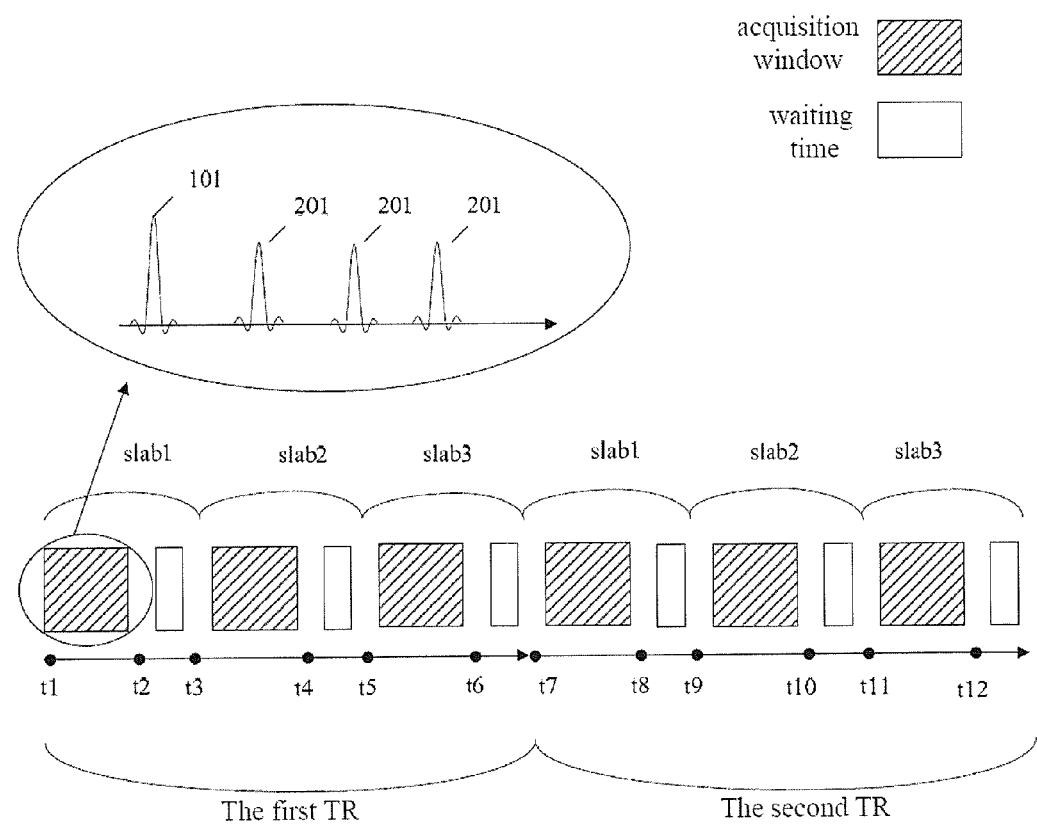
FIG. 3 is a diagram of the working principles of the first embodiment of a 3D-TSE imaging method provided by the present invention.

FIG. 3 is a diagram of the working principles of the first embodiment of a 3D-TSE imaging method provided by the present invention. Compared with the 3D-TSE imaging method in the prior art shown in FIG. 1, in FIG. 3, the applied refocusing pulse after the selective excitation pulse 101 is the selective refocusing pulse 201, and the excitation targets of the selective excitation pulse 101 and the selective refocusing pulse 201 are the same slab.

As shown in FIG. 3, more than one slab can be scanned successively within a TR, it can be assumed that there are three slabs adjacent to each other along the slice selection direction: the first slab1, the second slab2 and the third slab3 can be scanned successively within one TR. Time period t1-t2 is the acquisition window of the first slab in the first TR, and one selective excitation pulse 101 and more than one selective refocusing pulse 201 is applied successively to the first slab within time period t1-t2, and the excited protons in the first slab gradually return to the state before the excitation within time period t2-t7. Time period t3-t4 is the acquisition window of the second slab in the first TR. One selective excitation pulse 101 and more than one selective refocusing pulse 201 are applied successively to the second slab within time period t3-t4, and the excited protons in the second slab gradually return to the state before the excitation within time period t4-t9. Time period t5-t6 is the acquisition window of the third slab in the first TR, one selective excitation pulse 101 and more than one selective refocusing pulse 201 are applied successively to the third slab within time period t5-t6. The excited protons in the third slab gradually return to the state before the excitation within time period t6-t11. It can be seen that, with regard to the current slab, the magnetic resonance imaging system can achieve the scanning of other slabs in the time period waiting for the excited protons to return to the state before the excitation.

The reason for it not being possible to achieve the scanning of more than one slab within a TR in the prior art is that the refocusing pulses used in the prior art are non-selective refocusing pulses. That is to say, the refocusing pulses applied each time affect not only the current slab but also all the slabs in the examined tissues, therefore it is necessary that the scanning of the next slab can only begin until the excited protons in all the slabs have returned to the state before the excitation. The refocusing pulse used in the present embodiment is a selective refocusing pulse, and the refocusing pulse applied each time only affects the current slab, and the other slabs can be scanned simultaneously during the time period waiting for the excited protons to return to the state before the excitation.

The present embodiment can be optimized on the basis of the diagram of the working principles shown in FIG. 3, and there are mainly the following two types of optimization methods:

Firstly, in practical applications, due to reasons such as the imperfection of pulse design, etc., there are always differences between the position of the slabs excited by the selective excitation pulse or selective refocusing pulses and the ideal situation. For example, in an ideal situation, the first slab is excited first, then the second slab adjacent to the first slab is excited. In practical applications, however, when the first slab is excited, the protons in the junction between the first slab and the second slab are also excited. In order to overcome this undesirable effect, a magnetic resonance imaging device can excite the slabs with odd serial numbers, then excite the slabs with even serial numbers, alternatively, it can first excite the slabs with even serial numbers, then excite the slabs with odd serial numbers, so that when the excitation of the slabs in the odd (even) number sequence completes, the slabs in the even (odd) number sequence adjacent to each slab with odd (even) number sequence have already returned to the state before the excitation.

The pulses from the first group to the $(N-P)^{th}$ group in the N groups of pulses are applied in succession to the slabs with odd serial numbers, then the pulses from the $(N-P+1)^{th}$ group to the $N^{th}$ group are applied in succession to the slabs with even serial numbers. Alternatively, the pulses from the first group to the $P^{th}$ group in said N groups of pulses are applied in succession to the slabs with even serial numbers, and the pulses from the $(P+1)^{th}$ group to the $N^{th}$ group are applied in succession to the slabs with odd serial numbers; wherein P is the result of rounding down N/2.

As an example, if five slabs adjacent to each other are named as: the first slab, the second slab, the third slab, the fourth slab and the fifth slab in the order from top to bottom, then in the time sequence, the first slab, the third slab and the fifth slab are excited successively, then the second slab and the fourth slab are excited successively; alternatively, the second slab and the fourth slab are first excited successively, then the first slab, the third slab and the fifth slab are excited successively.

Secondly, each slab can also be regarded as being composed of several sub-slabs, and the above-mentioned solution can be applied to the scanning of the sub-slabs.

In this method, a slab is further divided into M sub-slabs, and the pulses from the first group to the $(M-Q)^{th}$ group in the M groups of sub-slabs are applied successively to the slabs with odd serial numbers. The pulses from the $(M-Q+1)^{th}$ group to the $M^{th}$ group are then applied successively to the slabs with even serial numbers. Alternatively, the pulses from the first group to the $Q^{th}$ group in said M groups of pulses are applied successively to the slabs with even serial numbers, then the pulses from the $(Q+1)^{th}$ group to the $M^{th}$ group are applied successively to the slabs with odd serial numbers. In this case, M is a positive integer greater than 1, and P is the result of rounding down M/2.

As an example, if a slab includes 32 slices, then one slab can be divided into 4 sub-slabs, with each slab including 8 slices, and if four sub-slabs adjacent to each other are named as the first sub-slab, the second sub-slab, the third sub-slab, and the fourth sub-slab along the slice selection direction, then in the time sequence, the first sub-slab, the second sub-slab, the third sub-slab and the fourth sub-slab can be first scanned successively; alternatively, the first sub-slab and the third sub-slab can be first scanned successively, then the second sub-slab and the fourth sub-slab are scanned successively; alternatively, the second sub-slab and the fourth sub-slab can be first scanned successively, then the first sub-slab and the third sub-slab are scanned successively.

The Second Embodiment

The first embodiment achieves the object of improving imaging efficiency, but the image quality can be further optimized on the basis of the improvement of imaging efficiency, and the second embodiment will be described in detail below.

There are four points to be illustrated. First, as noted in the above description, a selective excitation pulse means applying excitation pulse and slice selection gradient to the examined tissues simultaneously, thus making the excitation pulse be selective, and a selective refocusing pulse means applying the refocusing pulse and slice selection gradient to the examined tissues simultaneously, thus making the refocusing pulse be selective. In the present invention the slice selection gradient matching the excitation pulse is designated as the first slice selection gradient, and the slice selection gradient matching the refocusing pulse is designated as the second slice selection gradient. It can be seen that in the same group of pulses the first slice selection gradient and the second slice selection gradient select the same slab. In different groups of pulses the first slice selection gradient in one group and the second slice selection gradient in another group select different slabs. Secondly, those skilled in the art would understand that in the prior art the frequency of radio frequency pulses (such as excitation pulse and refocusing pulse) is usually set to be the resonance frequency of water protons. Thirdly, in the fat-suppressed imaging it concerns the signals of water protons, and there is no need to concern the signals of fat protons, while in the non-fat-suppressed imaging it concerns both signals of the water protons and that of the fat protons. Fourthly, only when the current protons are excited by both the excitation pulses and the refocusing pulses, the signals of the current protons can be presented in the final scan image, and if the current protons are only excited by the excitation pulses or only by the refocusing pulses, then the signals of the current protons will not be presented in the final scan image.

In the second embodiment, the description of the optimization below of image quality is divided into two aspects: for fat-suppressed imaging and for non-fat-suppressed imaging.

Figure 4:
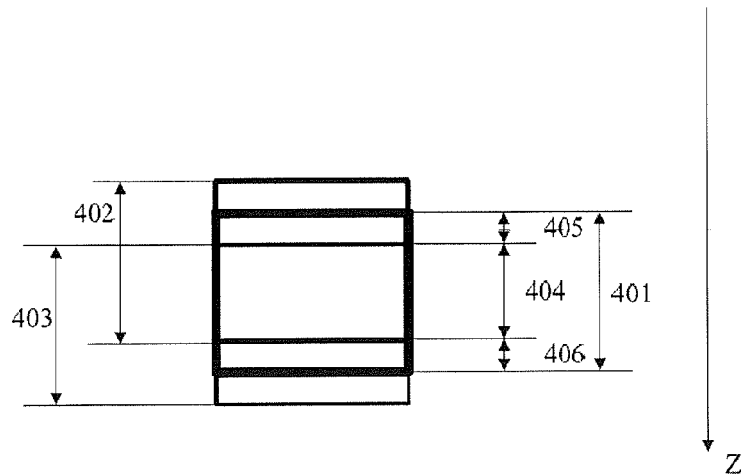
FIG. 4 is a schematic diagram of signal excitation in fat-suppressed imaging.

As to fat-suppressed imaging, preferably, the polarities of the first slice selection gradient and the second slice selection gradient are opposite, and FIG. 4 is a schematic diagram of signal excitation in fat-suppressed imaging, which can be analyzed in conjunction with FIG. 4.

As shown in FIG. 4, the first region 401 is the current slab, and the scan image to be obtained can present the signals of water protons in the first region 401, since in current MRI systems the frequency of radio frequency pulses is the resonance frequency of water protons. Therefore, the water protons in the first region can be excited by both the excitation pulses and the refocusing pulses. Therefore, the signals of water protons in the first region 401 thus can be obtained from the final scan image. However, since the resonance frequency of fat protons is lower than the resonance frequency of water protons, the currently used resonance frequency cannot appropriately excite the fat protons in the first region. Moreover, the polarities of the first slice selection gradient and the second slice selection gradient are opposite, the region where the fat protons are excited by the excitation pulses will drift relative to the first region 401, and the region where the fat protons are excited by the refocusing pulses will also drift relative to the first region 401. The drifting directions of the two are opposite, and it can be assumed that the second region 402 is the region where the fat protons are only excited by the excitation pulses and that the third region 403 is the region where the fat protons are only excited by the refocusing pulses. It can be seen that both signals of water protons and signals of fat protons can be presented in the scan image corresponding to the overlapped fourth region 404 of second region 402 and third region 403, and the signals of water protons are presented only in the scan images corresponding to the fifth region 405 and the sixth region 406.

As to the fat-suppressed imaging, the reason why it is not preferable for the polarities of the first slice selection gradient and the second slice selection gradient to be the same is as follows. When the polarities of the first slice selection gradient and the second slice selection gradient are the same, the region where the fat protons are excited by the excitation pulses and the region where the fat protons are excited by the refocusing pulses will drift to one direction relative to the first region. Eventually this will lead to the case that the region which can present both the signals of water protons and the signals of fat protons is larger than the fourth region, while in fat-suppressed imaging, it is desirable for the fat signals to be as low as possible.

Figure 5:
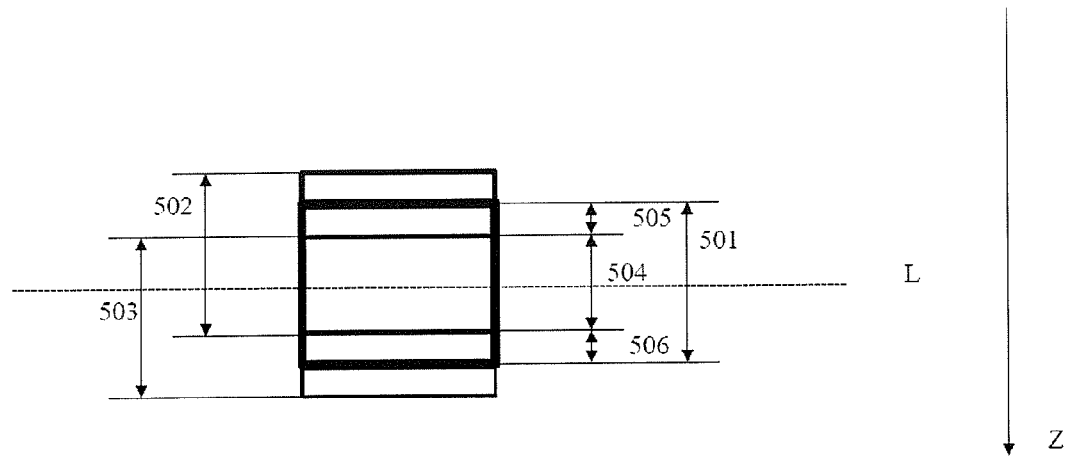
FIG. 5 is a schematic diagram of signal excitation in non-fat-suppressed imaging.

As to non-fat-suppressed imaging, preferably, the frequency of radio frequency pulses is smaller than the resonance frequency of water protons by 1.75 per million, and the lower of the first slice selection gradient and the second slice selection gradient can be the same or different. FIG. 5 is a schematic diagram of signal excitation in the non-fat-suppressed imaging, the situation that the polarities of the first slice selection gradient and the second slice selection gradient are the same is illustrated by way of example as shown in FIG. 5, and will be analyzed in conjunction with FIG. 5 below.

As shown in FIG. 5, the first region 501 is the current slab, the obtained scan image needs to present the signals of water protons and fat signals in the first region 501, since the resonance frequency of fat protons is lower than the resonance frequency of water protons by 3.5 per million in the current MRI systems, while the frequency of radio frequency pulses is smaller than the resonance frequency of water protons by 1.75 per million. Therefore, the currently used radio frequency pulses cannot appropriately excite the fat protons and the water protons in the first region 501. Moreover, since the polarities of the first slice selection gradient and the second slice selection gradient are the same, the resonance frequency of fat protons is lower than the frequency of radio frequency pulses by 1.75 per million, and the resonance frequency of water protons is higher than the frequency of radio frequency pulses by 1.75 per million. Therefore, the region where the fat protons are excited by the excitation pulses and the refocusing pulses will drift relative to the first region 501, and the region where the water protons are excited by the excitation pulses and the refocusing pulses will also drift relative to the first region 501. The drifting directions of the two are opposite. It can be assumed that the second region 502 is the region where the fat protons are excited by the excitation pulses and the refocusing pulses and the third region 503 is the region where the water protons are excited by the excitation pulses and the refocusing pulses. It can be seen that both signals of water protons and signals of fat protons can be presented in the scan image corresponding to the overlapped fourth region 504 of the second region 502 and the third region 503, while the signals of fat protons can be presented only in the scan image corresponding to the fifth region 505 and the signals of water protons can be presented only in the scan image corresponding to the sixth region 506. It can be seen that the fifth region 505 and the sixth region 506 do not satisfy the requirements by the scan images of non-pressure imaging. Presented by the fifth region 505 and the sixth region 506 in the scan image are the sideband artifacts in the current slab.

In order to overcome the sideband artifacts in the current slab, i.e., in order to achieve presentation of both signals of water protons and signals of fat protons in the scan images corresponding to the fifth region 505 and the sixth region 506, the data of the current slab can be further processed by using the over-sampling method in the prior art. In an ideal situation, the preset thickness of slab is a, and the thickness a of the slab is the length of the slab along the slice selection direction, that is, the width of the first region 501 in FIG. 5 is a. In practical applications, however, when the selective excitation pulses and the selective refocusing pulses are used for the excitation, the thickness of the excited slab is set to be 120%*a to 125%*a, i.e., the midline L of the first region 501 is regarded as the center of symmetry. The width of the upper half of the actually excited first region 501 is 110% to 112.5% of the preset slab thickness a, the width of the lower half of the actually excited first region 501 is 110% to 112.5% of the preset slab thickness a. Since the thickness of the actual excitation is greater than the preset slab thickness a, after the reconstruction of the image, the excessive regions are discarded, and the scan image is output according to the preset slab thickness a.

The above-mentioned over-sampling method can also be applied to the fat-suppressed imaging, which overcomes the sideband artifacts caused by other reasons, for example, poor selectivity of the pulse itself may also lead to sideband artifacts.

Furthermore, as to non-fat-suppressed imaging, the reason for setting the frequency of radio frequency pulses to shift downwards from the resonance frequency of water protons by 1.75 per million in the present embodiment is as follows. If the frequency of radio frequency pulses were the resonance frequency of water protons for non-fat-suppressed imaging, then the drifting region where the fat protons were excited by the refocusing pulses or the excitation pulses would equal twice the sixth region 506 or the fifth region 505. When the polarities of the first slice selection gradient and the second slice selection gradient are opposite, i.e. when the fat protons exited by the refocusing pulses and the excitation pulses drift in the opposite direction, the region which can present water protons and fat protons equals the result of the fourth region 504 minus the fifth region 505 and the sixth region 506. When the polarities of the first slice selection gradient and the second slice selection gradient are the same, i.e. the fat protons excited by the refocusing pulses and the excitation pulses drift in the same direction, the sideband artifacts appear only in the fifth region 505 or the sixth region 506 of the slab, so the area of sideband artifacts is twice that of the fifth region 505 or the sixth region 506. Since the over-sampling technique performs sampling after the thickness of the upper half and lower half of the slab have been proportionally enlarged, there is no doubt that the time of over-sampling is increased, and the scan efficiency is reduced.

Based on the above-introduced optimization solution of image quality for fat-suppressed imaging and non-fat-suppressed imaging, furthermore, the variable-rate selective excitation (VERSE) technique in the prior art can be combined so as to optimize the pulse width to the maximum extent. Those skilled in the art will understand that the shorter the pulse width, the better the image quality, but the higher the specific absorption rate (SAR) of the radio frequency. The VERSE technique can be compatible with the image quality and SAR so as to optimize the pulse width.

Figure 6A:
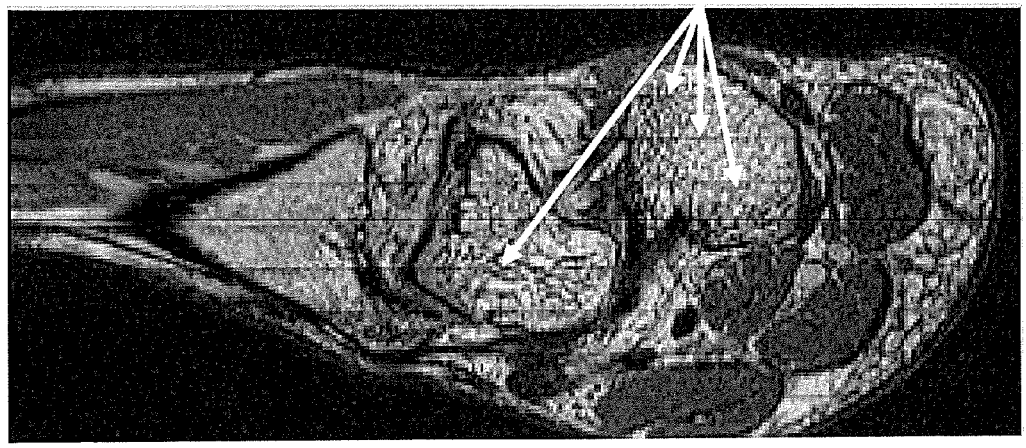
FIG. 6a is an image of the test results by using a 3D-TSE imaging method in the prior art.
Figure 6B:
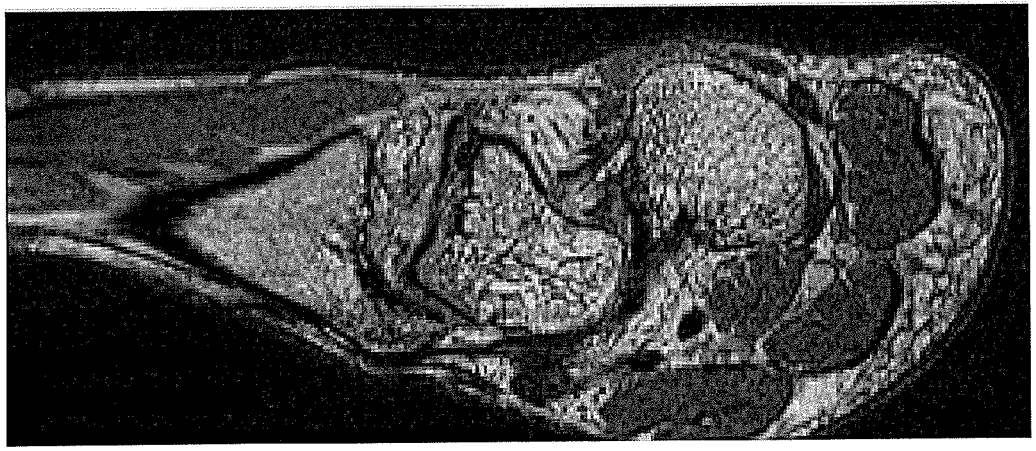
FIG. 6b is an image of the test results of a 3D-TSE imaging method provided by a second embodiment of the present invention.

FIG. 6a is an image of the test results by using the 3D-TSE imaging method in the prior art, the regions indicated by arrows are the sideband artifacts of the slab, FIG. 6b is an image of the test results by using the 3D-TSE imaging method provided by the second embodiment of the present invention, and by the comparison of FIG. 6a and FIG. 6b, it can be seen that the method provided by the second embodiment of the present invention can eliminate the sideband artifacts of the slab.

The Third Embodiment

The second embodiment achieves the object of improving imaging efficiency and eliminating the sideband artifacts of the slab, but the image quality can be further optimized on the basis of the first embodiment and the second embodiment, and the third embodiment will be further described in detail below.

Figure 7:
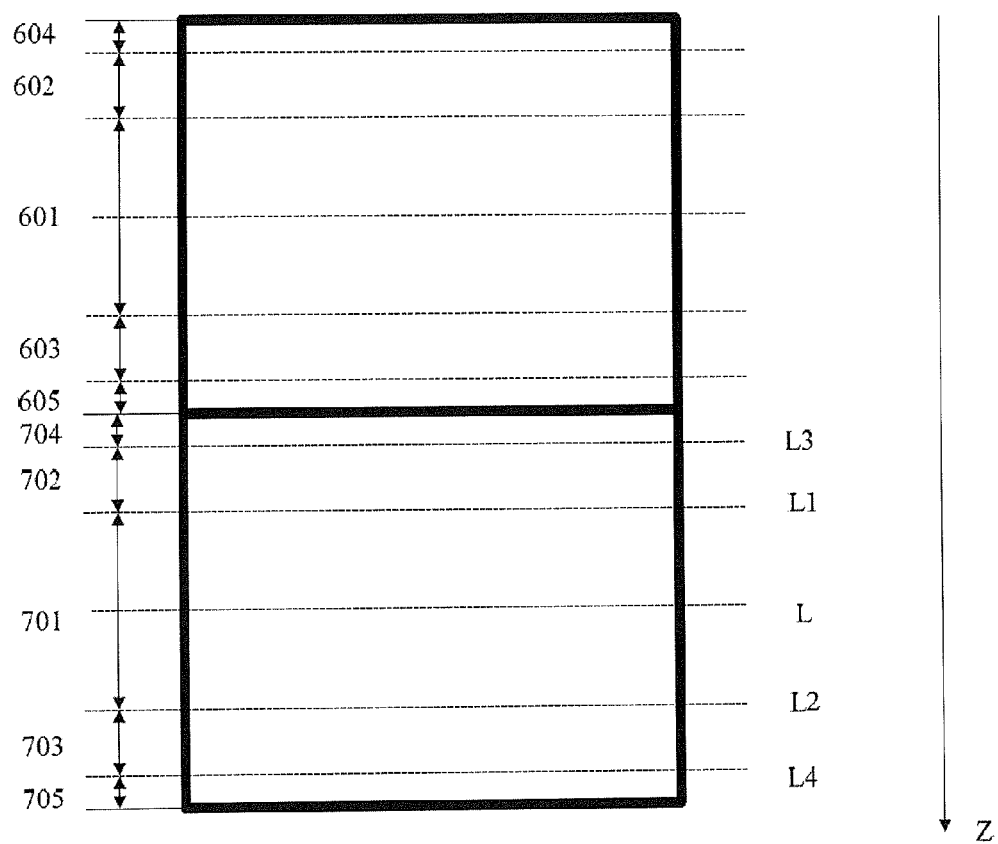
FIG. 7 is a schematic diagram of the strength and/or contrast of scan signals.

In practical applications, since the selectivity of excitation pulses or refocusing pulses is not ideal. Alternatively, since the inconsistency between the frequency of radio frequency pulses and the resonance frequency of the protons leads to the drift of the region of the excited protons compared with an ideal case, which finally reflects in the scan image and affects the strength and contrast of the scan signals to a certain extent. FIG. 7 is a schematic diagram of the strength and/or contrast of the scan signals. As shown in FIG. 7, the slab is divided into five regions by the straight lines L1, L2, L3, and L4 along the slice selection direction, in which the first region 701 accounts for about 70% of the thickness of the slab. The strength and contrast of signals in the first region 701 are relatively ideal, the second region 702 and the third region 703 are symmetrically distributed relative to the midline L of the slab, the sum of the total area of the second region 702 and the third region 703 accounts for about 20% of the thickness of the slab, and the signal contrast of the second region 702 and the third region 703 is relatively ideal. The signal strength, however, is relatively poor, and the sum of the total area of the fourth region 704 and the fifth region 705 accounts for about 10% of the thickness of the slab. Additionally, the strength and contrast of signals in the fourth region 704 and the fifth region 705 are relatively poor. It can be seen that the signals in the second region 702, the third region 703, the fourth region 704 and the fifth region 705 can be further corrected so as to optimize the image quality.

First, the signals in the second region 702 and the third region 703 (two regions adjacent to the middle region 701) are corrected, and the correction method can use histogram matching from the prior art. Simply speaking, the basic principle of histogram matching is as follows: one slice in the first region 701 closest to the dividing line L1 between the first region 701 and the second region 702 is selected, and one slice in the second region 702 closest to the dividing line L1 between the first region 701 and the second region 702 is selected. The size of signal strength of each signal in the two slices is respectively counted statistically. A first curve and a second curve are fitted respectively according to the statistical results, with the horizontal (vertical) coordinate of the curve being the values of signal strength and the vertical (horizontal) coordinate being the number of signals corresponding to a current value. If the shapes of the fitted two curves are similar, then one curve thereof is translated, and the degree of matching between the two curves in each translation distance is calculated. The translation distance corresponding to the maximum degree of matching is the first correction factor. Finally, the signal strength in the second region 702 and the third region 703 can be corrected by using the first correction factor.

Secondly, the signals in the fourth region 704 and the fifth region 705 (two edge regions) are corrected, and the correction method can use three-dimensional interpolation in the prior art. Simply speaking, the basic principle of three-dimensional interpolation is as follows: the size of the signal strength of each signal in the second region 702 adjacent to the fourth region 704 is counted statistically in the current slab. The size of the signal strength of each signal in the third region 603 adjacent to the fifth region 605 is counted statistically in the previous slab (the previous slab is the slice which is along the direction opposite to the slice selection direction and adjacent to the current slab). The signal strength in the fifth region 605 of the previous slab and in the fourth region 704 of the current slab is corrected according to the interpolation of the size of the signal strength in the second region 702 of the current slab and the third region 603 of the previous slab.

In summary, according to the technical solution of the present embodiment the signals of the second region, the third region, the fourth region and the fifth region of all slabs can be corrected so as to achieve the object of further optimizing image quality.

The technical solution provided by the above-mentioned three embodiments can be used in the conventional 3D-TSE imaging technology as well as the SPACE imaging technology.

It can be seen that on the basis of three-dimensional turbo spin echo imaging method, a first slice selection gradient is applied at the same time as applying each excitation pulse, and a second slice selection gradient is applied at the same time as applying each refocusing pulse, so that the refocusing pulses applied each time only affect the current slab, and other slabs can be scanned simultaneously during the time period waiting for the excited protons in the current slab to return to the state before the excitation, thus shortening the imaging time and improving the imaging efficiency.

Although modifications and changes may be suggested by those skilled in the art, it is the intention of the inventors to embody within the patent warranted hereon all changes and

We claim as our invention:

1. A method for three-dimensional turbo spin echo imaging, comprising:
   applying N groups of pulses in succession within a repetition time, with each group being used to scan one slab and including one excitation pulse and more than one refocusing pulse, wherein N is a positive integer greater than 1;
   operating the data acquisition unit to apply a first slice selection gradient at a same time as applying said excitation pulse, and to apply a second slice selection gradient at the same time as applying said refocusing pulse;
   operating the data acquisition unit to apply a phase encoding gradient after having applied each said refocusing pulse, then to apply a frequency encoding gradient and to acquire the scan signals during the duration of said frequency encoding gradient; and
   in a computer, reconstructing the images according to said scan signals.

2. The method as claimed in claim 1, comprising applying the pulses from the first group to the $(N-P)^{th}$ group in said N groups of pulses are applied successively to the slabs with odd serial numbers, and then applying the pulses from the $(N-P+1)^{th}$ group to the $N^{th}$ group are applied successively to the slabs with even serial numbers.

3. The method as claimed in claim 1, comprising applying the pulses from the first group to the $P^{th}$ group in said N groups of pulses successively to the slabs with even serial numbers, and applying the pulses from the $(P+1)^{th}$ group to the $N^{th}$ group in said N groups of pulses successively to the slabs with odd serial numbers, wherein P is the result of rounding down N/2.

4. The method as claimed in claim 1, comprising implementing said scan as fat-suppressed imaging, and setting the frequencies of the excitation pulse and the refocusing pulses to be equal to the resonance frequency of water protons, and setting the polarities of the first slice selection gradient and the second slice selection gradient are set to be opposite.

5. The method as claimed in claim 4, comprising correcting the strength of the scan signals after acquiring the scan signals.

6. The method as claimed in claim 5, comprising dividing the slab into 5 regions along the slice selection direction, correcting the strength of the scan signals of the two regions adjacent to the middle region by using histogram matching, and correcting the strength of the scan signals of the two edge regions by using three-dimensional interpolation.

7. The method as claimed in claim 1, comprising implementing said scan as non-fat-suppressed imaging, and setting the frequencies of the excitation pulse and the refocusing pulses to be smaller than the resonance frequency of water protons, and setting the polarities of the first slice selection gradient and the second slice selection gradient to be the same or opposite, and setting the thickness of the slab acted on by each group of pulses to be greater than a preset thickness of the slab.

8. The method as claimed in claim 4, comprising setting the frequencies of the excitation pulse and the refocusing pulses to be smaller than the resonance frequency of water protons by 1.75 per million, and setting the thickness of the slab acted on by said each group of pulses to be 120-125% of the preset thickness of the slab.

9. The method as claimed in claim 7, comprising correcting the strength of the scan signals after acquiring the scan signals.

10. The method as claimed in claim 9, comprising dividing the slab into 5 regions along the slice selection direction, correcting the strength of the scan signals of the two regions adjacent to the middle region by using histogram matching, and correcting the strength of the scan signals of the two edge regions by using three-dimensional interpolation.

* * * * *